United States Patent

Vulih et al.

[11] Patent Number: 5,680,072
[45] Date of Patent: Oct. 21, 1997

[54] DIFFERENTIAL INTERPOLATING SWITCHED CAPACITOR FILTER AND METHOD

[75] Inventors: Salomon Vulih, Neshanic St.; George Roalnd Briggs, Princeton, both of N.J.

[73] Assignee: Harris Corporation, Melbourne, Fla.

[21] Appl. No.: 590,940

[22] Filed: Jan. 24, 1996

[51] Int. Cl.[6] .............................. H03K 5/00; H03F 1/14
[52] U.S. Cl. ..................... 327/554; 327/558; 327/552; 330/9; 330/109; 333/173
[58] Field of Search .............................. 327/552, 553, 327/554, 94, 337, 558; 330/9, 107; 333/173

[56] References Cited

U.S. PATENT DOCUMENTS

| | | | |
|---|---|---|---|
| 4,331,894 | 5/1982 | Gregorian et al. | 327/95 |
| 4,430,629 | 2/1984 | Betzi et al. | 333/165 |
| 4,599,573 | 7/1986 | Senderowicz | 330/9 |
| 5,088,490 | 2/1992 | Pagliolo et al. | 327/554 |
| 5,327,092 | 7/1994 | Inogai et al. | 327/554 |
| 5,495,200 | 2/1996 | Kwan et al. | 327/553 |

*Primary Examiner*—Terry Cunningham
*Assistant Examiner*—Dinh T. Le
*Attorney, Agent, or Firm*—Rogers and Killeen

[57] ABSTRACT

A differential, interpolating, switched capacitor filter and method of operation in which non-interpolating stages of the filter are clocked at a first frequency and a subsequent interpolating stage of the filter is operated at double the first frequency to achieve improved smoothing of the output wave form. The switched capacitors in the interpolating stage which feed forward a differential input from a prior stage to an input to the interpolating stage, and which feed a differential output from the interpolating stage back to an input thereto are paired and switches are provided for the added capacitors so that all of these capacitors are switched. Capacitors which are directly coupled to feed forward a differential input from a prior stage to the interpolating stage are also paired, but only the added capacitor is switched. Other directly coupled capacitors which feed back from the output of the interpolating stage to the input of prior stages are not paired, but are switched to prevent unwanted feedback of the interpolated output to the prior, non-interpolating, stages.

11 Claims, 3 Drawing Sheets

5,680,072

DIFFERENTIAL INTERPOLATING SWITCHED CAPACITOR FILTER AND METHOD

BACKGROUND OF THE INVENTION

The present invention relates to switched capacitor filters and operation thereof, and more particularly to an interpolating stage for a differential switched capacitor filter and method of operation thereof.

Interpolating switched capacitor filters perform a variety of functions and are generally known (see, for example, the non-differential filter described in U.S. Pat. No. 4,331,894.) In such filters an operational amplifier typically has a terminal connected to a capacitor network in which two capacitors are gated responsive to receipt of clock phases $\phi1$ and $\phi2$ which alternate at the filter sampling frequency. Feed forward circuits include capacitors and switches to produce the desired interpolation, and feedback circuits include capacitors and switches to prevent feedback of interpolated signals.

Differential non-interpolating switched capacitor filters are also known, and FIG. 1 illustrates one stage of such a prior art filter. The stage shown may be used, for example, in a receive portion of a telephone system coder-decoder (CODEC). (Note that in the figures elements identified with a subscript starting with "a" have mirrored elements of the differential design identified with a subscript starting with "b".) Since the stage shown in FIG. 1 is not an interpolating filter, it provides an output stepping at the sampling frequency. Switched capacitors C2 operate so that their charge is being sampled in clock phase $\phi2$ (i.e., C2 is charged to a voltage referenced to $V_{MID}$) and transferred to the operational amplifier input terminals during clock phase $\phi1$ (i.e., C2 is discharged.) Capacitors C2 perform the same functions as the resistors used in conventional active RC filters. Capacitors C5 and C6 are also switched capacitors, with C5 feeding forward (FF) a differential input from a previous stage of the filter (not shown) and C6 feeding back (FB) a differential output to a previous stage.

Capacitors C4 in the feed forward path from the previous stage to the input of the stage shown and capacitors C3 in the feedback path from the output of the stage shown to the previous stage are not switched. These direct capacitor couplings are required for most CODEC switched capacitor filter implementations to obtain the desired filtering characteristics.

In many applications it is desirable to further smooth the output waveform of the differential filter stage of FIG. 1. This can be done by effectively switching the stage at a multiple of the filter input stage sampling frequency by interpolating the sampled inputs. The interpolating filter of the above-cited U.S. patent does not provide a reasonable solution because its circuitry is too cumbersome for application to a differential filter, and even if it could be adapted for a differential filter a more compact and easily operable solution is possible with the invention described herein.

Accordingly, it is an object of the present invention to provide a novel filter and method of operating an interpolating switched capacitor filter which is compact and easily operated, thereby obviating the problems of the prior art.

It is another object of the present invention to provide a novel filter and method in which an input section of the filter, with any number of stages, operates non-interpolating at a sampling frequency and an output interpolating stage provides an output at effectively double the sampling frequency.

It is yet another object of the present invention to provide a novel differential filter and method in which an output stage includes two parallel switched capacitor paths connecting each differential input and respective opposite polarity differential output of a differential amplifier, and two parallel switched capacitor paths for each input to the differential amplifier from a previous stage differential amplifier outputs.

It is still another object of the present invention to provide a novel differential filter and method in which each differential output of a stage of the input section of the filter is connected to each differential input to the output stage through a circuit which has a first ungated capacitor in a first path and a second gated capacitor in a second path parallel to the first path which is gated at the sampling frequency to effectively interpolate the differential signals applied to the output stage.

It is a further object of the present invention to provide a novel differential filter and method in which each differential output of the output stage of the filter is connected to each differential input of a stage of an input section through a feedback path with a capacitor which is gated at the sampling frequency.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 2:
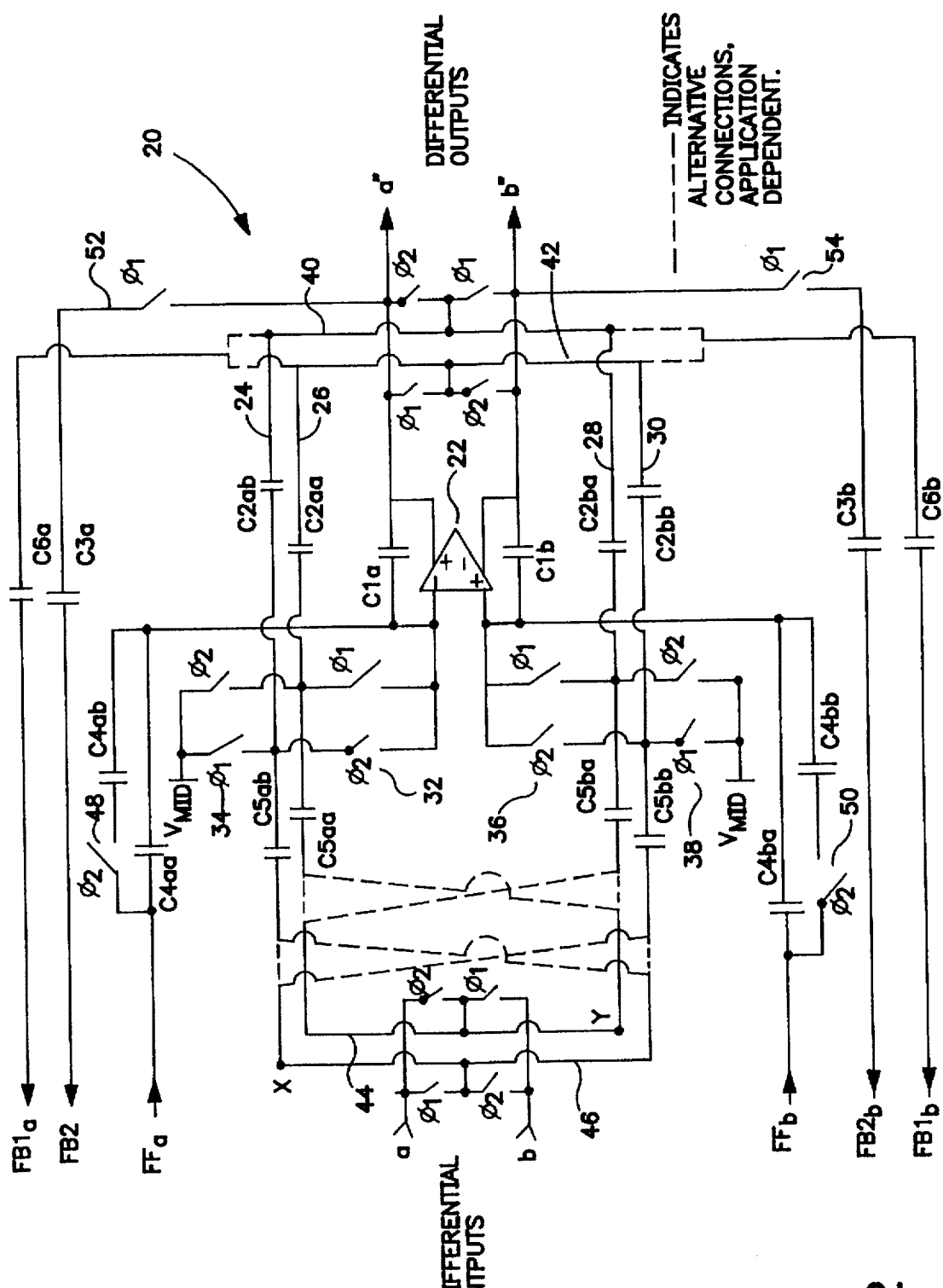
FIG. 2 is a circuit diagram of an embodiment of an interpolating output stage of a differential switched capacitor filter of the present invention.

An understanding of the present invention may be facilitated by consideration of three types of capacitors which may appear in embodiments of the present invention, one of which is illustrated in FIG. 2. The first type of capacitors are switched capacitors which feed forward a differential output from a prior, non-interpolating, stage to an input to the interpolating stage (e.g., C5), or which feed a differential output from the interpolating stage back to an input to the interpolating stage (e.g., C2.) These capacitors are paired (e.g., C5aa and C5ab, C5ba and C5bb; C2aa and C2ab, C2ba and C2bb) and switches are provided for the added capacitors so that all the capacitors are switched.

The second type are directly coupled (non-switched) capacitors which feed forward a differential output from a prior, non-interpolating, stage to the interpolating stage (e.g., C4.) These capacitors are also paired (e.g., C4aa and C4ab, C4ba and C4bb), but in contrast to the first type only the added capacitor is switched.

The third type are directly coupled capacitors which feed back from the output of the interpolating stage to the input of prior, non-interpolating, stages (e.g., C3.) These capacitors are neither paired nor changed in value from the original single capacitor, but are switched to prevent unwanted feedback of the interpolated output to the prior, non-interpolating, stages.

With further reference to FIG. 2, an embodiment of an interpolating stage 20 of a differential interpolation switched capacitor filter of the present invention may include a differential amplifier 22 and parallel paths 24 and 26 with capacitors C2aa and C2ab, and parallel paths 28 and 30 with capacitors C2ba and C2bb for connecting outputs to respective opposite polarity inputs of differential amplifier 22. These are type one capacitors discussed above and have substantially equal capacitances. Switches 32, 34 may be added to accommodate parallel path 24, and switches 36, 38 for path 30, and connections 40 and 42 may be added to the differential output of stage 20.

Switched capacitors C5aa and C5ab, C5ba and C5bb which feed forward a differential output from a prior, non-interpolating, stage (only a portion of which is shown) to an input to the interpolating stage 20 may also be provided. These are type one capacitors discussed above and have substantially equal capacitances. Connections 44 and 46 may be added to the differential input of stage 20, without the need for additional switches.

Capacitors C4aa and C4ab, C4ba and C4bb which feed forward a differential output from a prior, non-interpolating, stage to interpolating stage 20, and switches 48 and 50 for the added capacitors may be provided. Each pair of these capacitors have capacitances (not necessarily equal) which average about half the capacitance of the original single capacitor. Double the number of charge steps is produced by capacitors C4xx (i.e., two packets of charge per cycle) to generate the desired double number of voltage steps at the output of interpolating stage 20.

Capacitors C3a and C3b feed back differential outputs from the output of interpolating stage 20 to the input of a prior, non-interpolating, stage. These capacitors may have the same capacitance as the original capacitor. The prior, non-interpolating stages may continue to operate at the sampling frequency and thus need to look at only one of the clock phases $\phi 1$ or $\phi 2$ in order to keep their characteristics unchanged. Switches 52 and 54 may be added to prevent unwanted feedback of the interpolated output from stage 20 to the prior, non-interpolating, stages by gating capacitors C3a and C3b during one of the phases. Note that capacitors C6a and C6b which feed back a differential output from interpolating stage 20 to an input of a prior, non-interpolating, stage are already gated and thus prevent unwanted feedback without the need for additional switches or connections.

The remainder of the circuitry needed to provide a complete stage is conventional (e.g., such as in FIG. 1) and need not be described for those of skill in the art.

Figure 1:
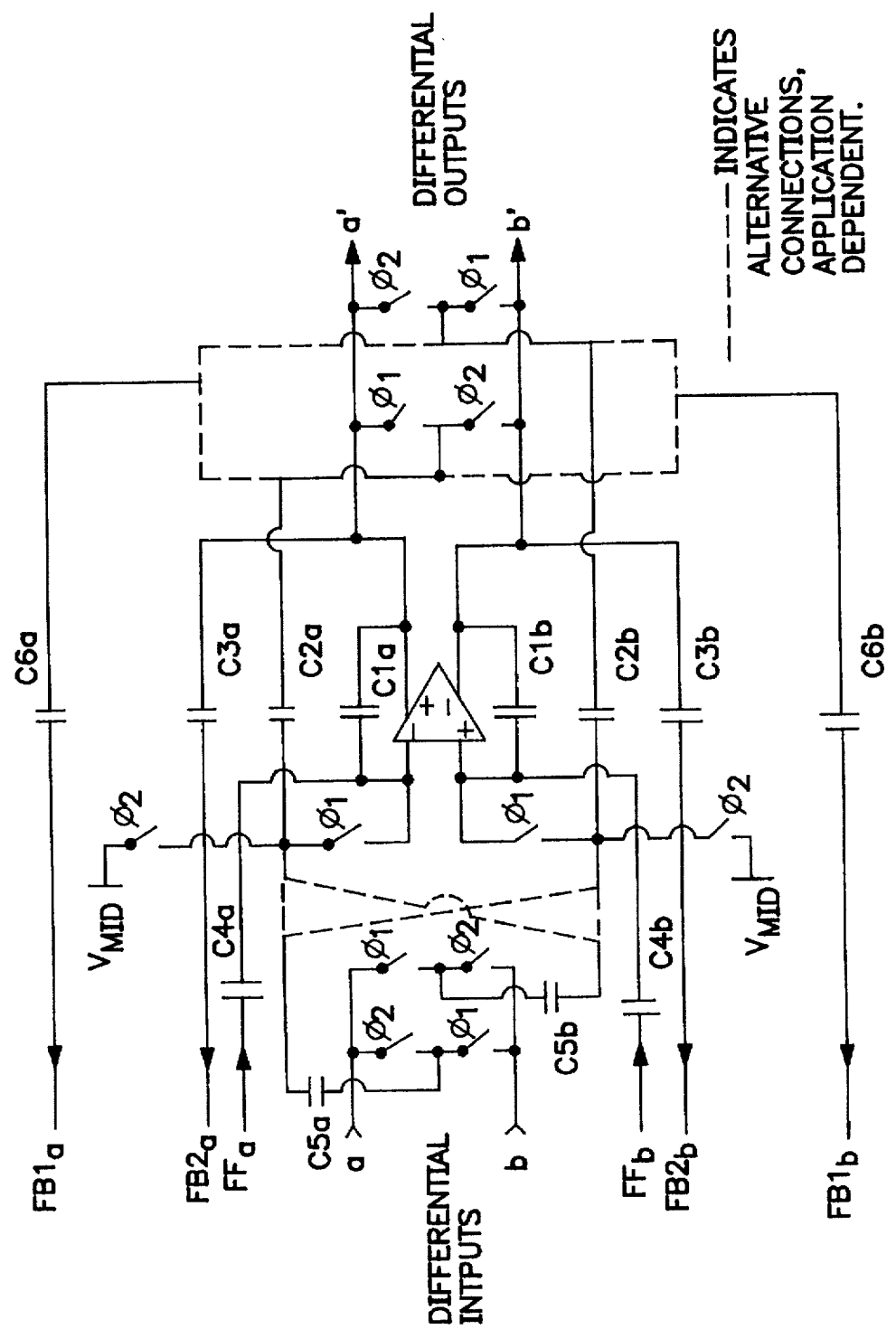
FIG. 1 is a circuit diagram of an output stage of a differential switched capacitor filter of the prior art.

In operation, switches identified with $\phi 1$ and $\phi 2$ close during the respective clock phases so that during phase $\phi 1$ one capacitor (e.g., C2aa) is sampling and the other capacitor (C2ab) is moving the charge, and during phase $\phi 2$ the sampling and moving are reversed. If the same output values as the filter of FIG. 1 are desired, but at double the sampling frequency, the capacitances of capacitors C2xx and C5xx may be half of that of capacitors C2x and C5x respectively of FIG. 1 in order to avoid gain multiplication.

The filter stage in FIG. 2 is differential and, as such, the parallel switched capacitor paths from output to input in interpolating stage 20, the parallel switched capacitor paths in the prior stage output to interpolating stage 20 input, and the gated feedback path paralleled with an ungated feedback path are repeated for the negative input. These features need not be limited to differential switched capacitor filters and may be applied to non-differential switched capacitor filters as well. The switches may be any conventional switch, for example field effect transistors as is customary for such filters.

If capacitances of capacitors C2, C4, and C5 are less than the unit (or standard) capacitor used in laying out a non-interpolating filter, the smallest of these capacitors may be taken as the new unit capacitor. Alternatively, bucking methods to obtain an effective capacitance smaller than that of the unit capacitor may be used to allow the unit capacitor to remain unchanged. For bucking to work, both polarity outputs for each stage must be available and this requires a filter of differential design.

Figure 3:
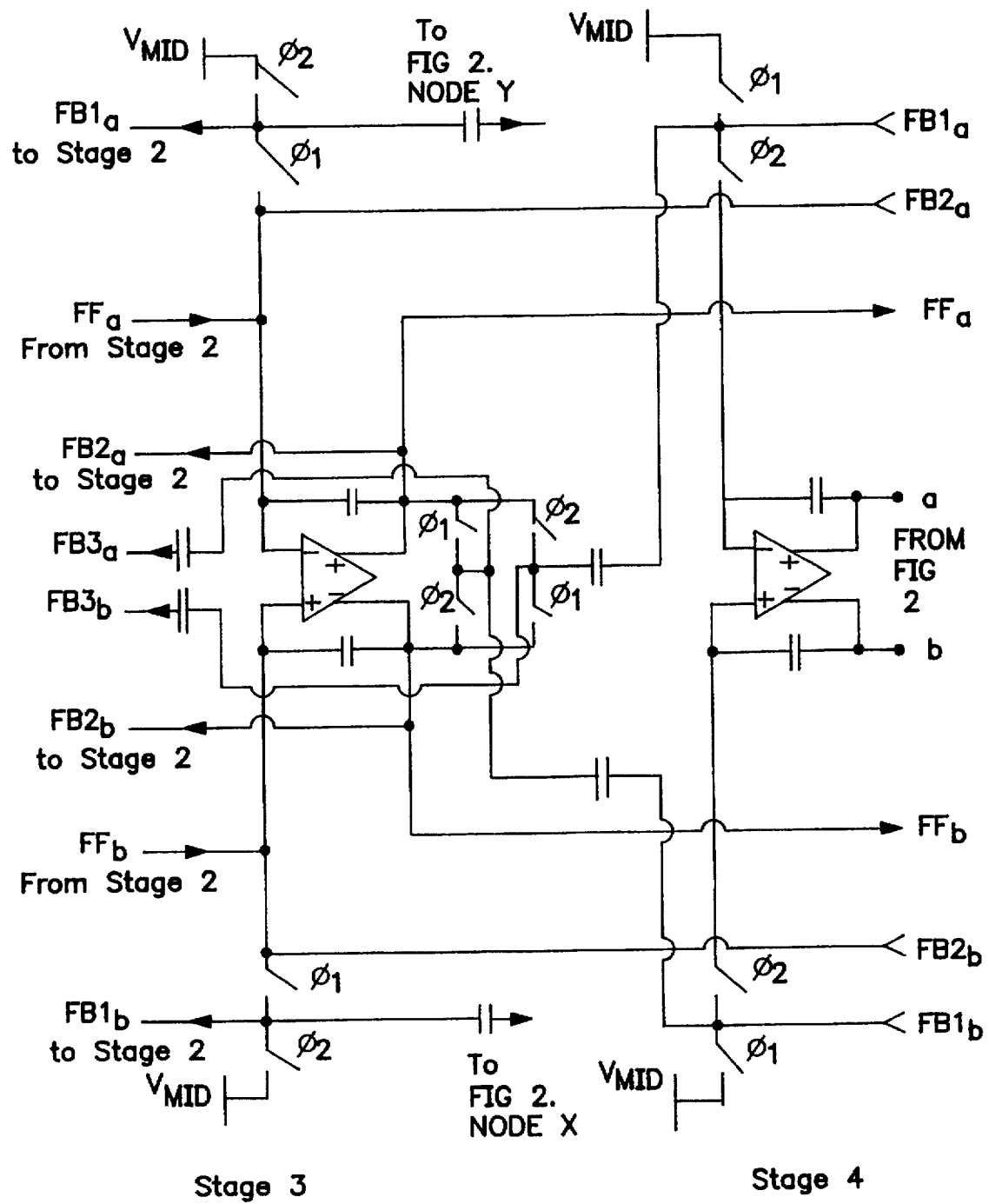
FIG. 3 is a partial circuit diagram of two stages of a four stage input section for a leap frog type differential interpolating switched capacitor filter which may be used in a telephone system CODEC, in which the interpolating stage of FIG. 2 is the output stage.

FIG. 3, when joined to FIG. 2 as indicated, is a partial diagram of an embodiment of a five stage leap-frog type differential switched capacitor low pass filter for a receive section of a CODEC. FIG. 3 includes non-interpolating stages 3 and 4 of the five stage filter, with interpolating output stage 5 being shown in FIG. 2 and non-interpolating stages 1 and 2 being substantially the same as stages 3 and 4 and not shown.

By way of further background, the output of a low pass filter is provided to an analog (non-switched capacitance) smoothing filter (not shown) to remove the clocking signal sidebands introduced by the 128 KHz clock used by the low pass filter. If the receive section of the CODEC has a 1 KHz sine wave input, low pass filter 50 causes this signal to have discrete sidebands at 128 KHz±1 KHz. The clock frequency should be attenuated by about 20 dB to improve the efficiency of the smoothing filter. To attain a 20 dB attenuation, the 3 dB point of the smoothing filter has to be much lower than 128 KHz, but not so low as to interfere with the band of the low pass filter; this frequency may be 20 KHz to 30 KHz. For a smoothing filter to attain such characteristics, large capacitors and/or resistors are needed. However, the size of the capacitors and/or resistors in the smoothing filter may be reduced if the low pass filter output is at 256 KHz, instead of 128 KHz. The five stage filter of FIGS. 2 and 3 provides such a result. Operation of stage 5, the interpolating stage, is discussed above and the operation of non-interpolating stages 1–4 is conventional.

The present embodiments relate to doubling the speed of operation of the output section. A multiple of N times the speed of operation may also be achievable by using N clock phases $\phi 1, \phi 2, \phi 3 \ldots \phi N$ and N parallel switched capacitor paths in a circuit similar to that discussed above, although the complexity of such a circuit may overwhelm any benefits obtained from the increase in speed. Typically, the smoothing obtained by doubling the speed is sufficient.

Further, the second and third types of capacitors discussed herein (e.g., C3 and C4) may not be needed in embodiments of the present invention which are not used in CODECs.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of operating a differential multistage switched capacitor filter to provide an interpolated output, the method comprising the steps of:

(a) operating an input stage of the filter at a first clocking frequency;

(b) providing an interpolated output from an output stage of the filter at double the first clocking frequency, the output stage having a differential amplifier, the interpolated output being provided by;

(c) in a first set of two parallel paths connecting a differential input to the amplifier and respective opposite polarity differential output of the amplifier, switchably connecting a capacitor in each of the first set of two parallel paths so that one capacitor is charging and the other is discharging during a first clock phase and so that the charging and discharging are reversed in a second clock phase; and (d) in a second set of two parallel paths respectively connecting a differential output from the input stage to said differential input to the amplifier, switchably connecting a further capacitor in each of the said second set of two parallel paths so that one said further capacitor in one of said paths is charging and the other said further capacitor in the other of said second set of two further parallel paths is discharging during the first clock phase and so that the charging and discharging are reversed in the second clock phase.

2. The method of claim 1 further comprising the step of gating said differential output from the output stage feeding back to an input to the input stage through a feedback capacitor at the first frequency in order to prevent the interpolated output from reaching the input stage.

3. The method of claim 2 further comprising the step of feeding forward said differential output from the input stage to said differential input to the amplifier through a circuit which has a third set of two parallel paths, a first path of said third set of two parallel paths with an ungated capacitor therein and a second path of said third set of two parallel paths with a gated capacitor therein which is gated at the first clocking frequency.

4. The method of claim 1 further comprising the step of feeding forward said differential output from the input stage to said differential input to the amplifier through a circuit which has a third set of two parallel paths, a first path of said third set of two parallel paths with an ungated capacitor therein and a second path of said third set of two parallel paths with a gated capacitor therein which is gated at the first clocking frequency.

5. A switched capacitor filter comprising:

at least one input stage for operating at a first frequency;

an output stage for providing an interpolated output at double the first frequency, said output stage comprising, an amplifier having two parallel paths connecting a differential input and respective opposite polarity output thereof, each of said two parallel paths having a capacitor therein and switching means for switchably connecting said capacitor in each of said two parallel paths so that one said capacitor in one of said two parallel paths is charging and said capacitor in the other of said two parallel paths is discharging during a first clock phase and so that the charging and discharging are reversed in a second clock phase, and two further parallel paths each respectively connecting an output from said input stage to an input to said amplifier, each of said two further parallel paths having a further capacitor therein and switching means for switchably connecting said further capacitor in each of said two further parallel paths so that one said further capacitor in one of said two further parallel paths is charging and said further capacitor in the other of said two further parallel paths is discharging during the first clock phase and so that the charging and discharging are reversed in the second clock phase.

6. The filter of claim 5 further comprising a feedback path for feeding back the interpolated output from said output stage to said input to said input stage, said feedback path having a feedback capacitor and means for gating said feedback capacitor at the first frequency in order to prevent the interpolated output from reaching said input stage.

7. The filter of claim 4 further comprising a feed forward path for feeding forward said output from said input stage to said input to said amplifier, said feed forward path comprising a first path with an ungated capacitor therein and a second path parallel to said first path which has a gated capacitor therein and switching means for gating said gated capacitor in said second path at the first clocking frequency.

8. The filter of claim 5 further comprising a feed forward path for feeding forward said output from said input stage to said input to said amplifier, said feed forward path comprising a first path with an ungated capacitor therein and a second path parallel to said first path which has a gated capacitor therein and switching means for gating said gated capacitor in said second path at the first clocking frequency.

9. An N stage (N being at least two), differential switched capacitor low pass filter for a telephone system CODEC comprising:

N−1 serially connected input stages for operating at a first frequency; and an interpolating output stage for providing an interpolated output at double the first frequency, said output stage comprising, a differential amplifier having two pairs of parallel paths, each of said pairs connecting a differential input and respective opposite polarity differential output thereof, each of said parallel paths having a capacitor therein and switching means for switchably connecting said capacitor in said each of said parallel paths so that one said capacitor is charging and the other is discharging during a first clock phase and so that the charging and discharging are reversed in a second clock phase, two further pairs of parallel paths, each of said further pairs connecting differential outputs from said input stages to said differential input to said amplifier, each of said further parallel paths having a capacitor therein and switching means for switchably connecting said capacitor in each of said further parallel paths so that one said capacitor is charging and the other is discharging during a first clock phase and so that the charging and discharging are reversed in a second clock phase, two feedback paths, each of said feedback paths for feeding back said differential outputs from said output stage to inputs to said input stages, each of said feedback paths having a feedback capacitor and switching means for gating said feedback capacitor at the first frequency in order to prevent the interpolated output from reaching said input stage, and two feed forward paths, each of said feed forward paths for feeding forward said differential outputs from said input stages to said differential input to said amplifier, each of said feed forward paths comprising a first path with an ungated capacitor therein and a second path parallel to said first path which has a capacitor therein and switching means for gating said capacitor in said second path at the first clocking frequency.

10. The filter of claim 9 wherein said capacitors in said parallel paths have substantially equal capacitances, and said capacitors in said further parallel paths have substantially equal capacitances.

11. The filter of claim 9 wherein each of said switching means comprises a field effect transistor.

* * * * *